United States Patent [19]

Bupp et al.

[11] Patent Number: 4,554,182

[45] Date of Patent: Nov. 19, 1985

[54] METHOD FOR CONDITIONING A SURFACE OF A DIELECTRIC SUBSTRATE FOR ELECTROLESS PLATING

[75] Inventors: James R. Bupp; Gary K. Lemon; Voya Markovich, all of Endwell; Carlos J. Sambucetti, Croton-on-Hudson; Stephen L. Tisdale; Donna J. Trevitt, both of Vestal, all of N.Y.

[73] Assignee: International Business Machines Corporation, Armonk, N.Y.

[21] Appl. No.: 696,879

[22] Filed: Jan. 31, 1985

Related U.S. Application Data

[63] Continuation of Ser. No. 540,962, Oct. 11, 1983, abandoned.

[51] Int. Cl.$^4$ .................................................. C23C 3/02
[52] U.S. Cl. ..................................... 427/304; 156/630; 156/632; 156/666; 156/901; 430/315; 430/327; 427/305; 427/306; 427/98
[58] Field of Search .......................... 427/98, 304–306; 430/315, 327; 156/630, 632, 666, 901

[56] References Cited

U.S. PATENT DOCUMENTS

| 4,448,804 | 5/1984 | Amelio | 427/304 |
| 4,478,883 | 10/1984 | Bupp | 427/304 |

FOREIGN PATENT DOCUMENTS

| 3137587 | 4/1983 | Fed. Rep. of Germany . |
| 0100452 | 2/1984 | France . |

*Primary Examiner*—John D. Smith
*Attorney, Agent, or Firm*—Pollock, Vande Sande & Priddy

[57] ABSTRACT

Method for electroless plating metals, such as copper, onto non-conductive substrate surfaces. The method comprises bringing the surfaces into contact with an aqueous composition containing $H_2SO_4$ and a multifunctional cationic copolymer containing at least two available cationic moieties and then activating the surfaces by treating them with a colloidal solution containing palladium chloride, stannous chloride and HCl.

The inventive method is particularly useful in processes for producing metal circuits on substrates of glass, thermoplastics and thermosetting resins, such as epoxy cards and boards. The method is also applied in reworking substrates having already undergone copper plating and having been rejected due to failures.

46 Claims, No Drawings

METHOD FOR CONDITIONING A SURFACE OF A DIELECTRIC SUBSTRATE FOR ELECTROLESS PLATING

This application is a continuation of application Ser. No. 540,962, filed 10/11/83 now abandoned.

BACKGROUND OF THE INVENTION

The invention relates to a method for conditioning at least one surface of a dielectric substrate for electrolessly plating a conductive metal thereon.

The process of electrolessly plating a metal (copper) onto a dielectric substrate is described for example in U.S. Pat. No. Re. 28,042 to Rhodenizer. One of the steps in this process is the seeding or catalyzing of the substrate surface prior to deposition of the metal onto the surface. This step is necessary since dielectric substrates are non-conductive.

Among the more widely employed procedures for catalyzing a substrate is the treatment of the surface with a stannous chloride sensitizing solution and a palladium chloride activator. For instance, one method for catalyzing a dielectric substrate is exemplified by U.S. Pat. No. 3,011,920 to Shipley which includes sensitizing the substrate by first treating it with a solution of a colloidal metal, accelerating the treatment with a selective solvent to remove protective colloids from the sensitized dielectric substrate and then electrolessly depositing a metal coating on the sensitized substrate; for example, with copper from a solution of a copper salt and a reducing agent.

U.S. Pat. Nos. 4,008,343 to Cohen et al and 3,562,038 to Shipley, Jr. et al also relate to methods for catalytically activating a surface with solutions containing Pd and Sn salts.

There have also been suggestions in the patent literature of treating substrates with certain surfactants. In particular, U.S. Pat. No. 4,301,190 to Feldstein suggests a pre-treatment of a substrate with an "adsorption modifier" to enhance the attachment to the substrate of a non-noble metal catalyst. Certain surfactants, hydride oxide sols and certain complexing agents are suggested as "adsorption modifiers".

U.S. Pat. No. 3,563,784 to Innes et al suggests a method of pretreating nonconductors for plating including a step of treating the surface with certain monofunctional surfactants, rinsing, and then activating either by a "two-step stannous chloride-palladium chloride treatment or the one-step acid, tin-palladium hydrosol treatment."

U.S. Pat. No. 3,684,572 to Taylor relates to a method of plating non-conductors including steps of treating the surface of the non-conductors with certain quaternary amine monofunctional or single charged surfactants after etching and before catalyzing the surface.

U.S. Pat. No. 3,573,937 to Drotar et al relates to a process for plating a non-conductive substrate. Reference is made therein to a step of rinsing the substrate with certain detergents before sensitizing with stannous chloride and activating with palladium chloride.

U.S. Pat. Nos. 3,515,649 to Hepfer; 3,877,981 to Arnold; and 3,930,072 to Wilks are of interest in showing the use of surfactants in plating processes in steps prior to the deposition of a catalyst.

U.S. Pat. No. 4,008,343 to Cohen et al suggests a process for electroless deposition wherein the catalytically prepared surface is rinsed with an aqueous acid solution with a pH of less than 1.5. The acid used is hydrochloric acid, perchloric acid, or nitric acid.

U.S. Pat. No. 3,491,922 to Wilson describes the application of a cationic film forming resin, specifically, melamine-formaldehyde resins, polyalkylene-amines, alkylated-methylol-melamines, triazine-formaldehyde and urea formaldehyde resins, onto substrate surfaces to be subsequently plated.

In copending application Ser. No. 398,140 and now U.S. Pat. No. 4,478,883 to Bupp et al assigned to the assignee of the present application a method for conditioning surfaces of dielectric substrates for the electroless plating is disclosed in which a copolymer of a non-reactive backbone chain of polyacrylamide to which are attached short chains of a tetra-alkyl-ammonium compound, with multiple charge functionality dissolved in a diluted inorganic acid, such as hydrochloric acid, is applied to the substrate surface prior to the activation.

Especially if the last of the cited methods is used, a very homogeneous metallization with excellent adhesion to the substrate is obtained. However if circuit lines are to be formed additively on the substrate surface (i.e., by forming a photoresist mask on the activated surface prior to plating), there is still the problem of residual resist (resist blistering) on the substrate surface after the developing step and the plated circuit lines tend to widen close to the substrate surface (line tailing).

Resist blistering can cause interruption in metal lines and line tailing shorts between adjacent metal lines.

SUMMARY OF THE INVENTION

It is the object of the inventive method to provide an improved method for conditioning substrate surfaces for electroless plating.

It is another object of the inventive method to provide an improved method for conditioning substrate surfaces for selective electroless plating.

It is a further object of the inventive method to provide an effective process for prohibiting resist blistering and line tailing.

These objects are to be achieved without increasing the number of the necessary process steps.

These objects are achieved by a method as indicated at the beginning of this specification comprising the steps:

Bringing at least one surface of a substrate into contact with a composition containing $H_2SO_4$ and a multifunctional cationic copolymer containing at least two available ionic moieties; and activating the surface by bringing it into contact with a composition containing palladium chloride and stannous chloride.

It appears that the replacement of the HCl used in co-pending application Ser. No. 398,140 by $H_2SO_4$ is responsible for the factual elimination of resist blistering and line tailing by the inventive method.

The inventive method is preferably applied in processes for producing metal circuits on substrates of glass, thermoplastics and thermosetting resins, such as epoxy cards and boards. The method is also applied in reworking substrates having already undergone copper plating and having been rejected due to failures.

Advantageous embodiments of the invention are disclosed in the subclaims.

DESCRIPTION OF THE PREFERRED EMBODIMENT

The invention will become more apparent from the following detailed description.

The inventive method is applicable to conditioning a wide variety of dielectric substrates for electroless plating metals, such as copper. Dielectric substrates including thermoplastic or thermosetting resins and glass may be treated in accordance with the present invention.

Typical thermosetting polymeric materials include epoxy, phenolic base materials and polyamides. The dielectric materials may be molded articles of the polymers containing fillers and/or reinforcing agents such as glass filled epoxy or phenolic based materials. Examples of some suitable thermoplastic polymeric materials include polyolefins, such as polypropylene, polysulfones, polycarbonates, nitrile rubbers and ABS polymers.

The term "surface" as employed herein refers to the surfaces inside through-holes as well as to major surfaces of the substrate. For instance, the present invention is useful for seeding the plated through-holes where the circuitry is being applied by either additively plating upon a thin layer of peel-apart copper or by a subtractive process. Also the present invention is useful for seeding in an electroless direct bond (EDB) process. In this case the circuitry is additively plated both in the holes and on the areas of the surface exposed in the openings of a photoresist mask selectively applied to the substrate surface.

Prior to the initiation of the inventive method, the through-holes used to receive the vias connecting different levels of circuitry are made, if required, and the dielectric with the through-holes is suitably cleaned and preconditioned. For instance, the preconditioning can include creation of active sites by physical means such as sand and/or vapor blasting and/or chemical methods such as solvent swelling. A typical solvent is N-methylpyrrolidone. The substrate can also be pretreated with a sulfochromic acid composition.

If the inventive method is applied in a process for selectively electroless plating a metal, such as copper, onto the substrate surface, the following steps for preconditioning the surface are preferably applied.

Onto the surface of the dielectric substrate a metal sheet having a roughened surface is laminated by pressing the roughened surface of that metal sheet against the surface. The metal sheet has a thickness of about 25.4 $\mu$m. Subsequently the metal sheet is completely etched off. Apparently at this stage of the process anchor points for the copper have developed at the surface to be plated. These anchor points facilitate the plating of the metal afterwards and improve its adhesion to the surface.

If through-connections are formed in the substrate (e.g., if printed circuits on both seeds of a flat substrate have to be connected), holes are now drilled through the substrate, preferably by a laser beam or by mechanical drilling. Subsequently the holes are cleaned either by vapor blasting or chemical methods, such as solvent swelling. It is also possible to produce the holes prior to the removing of the copper sheet.

The next step is a cleaning step, where the substrate is preferably cleaned for about five minutes at a temperature of between 45° C. and 60° C. with a alkaline cleaner consisting of a solution containing sodium phosphate and sodium silicate and having a pH value of 13. The cleaner is rinsed off with deionized water having a temperature of between 45° C. and 60° C.

In accordance with the present invention the substrate is treated with an aqueous solution containing $H_2SO_4$ and a multifunctional cationic copolymer. The copolymer is a multifunctional cationic material in that it contains at least two active or available cationic functional moieties. The preferred ionic moieties are quaternary phosphonium and quaternary ammonium groups. Copolymers containing at least two cationic moieties are commercially available and need not be described herein in detail. Examples of commercially available multifunctional cationic copolymers are Reten 210 and Reten 220, available from HERCULES, description of which can be found in "Water-Soluble Polymers", Bulletin VC-482A, HERCULES Inc., Wilmington, Del. 19899, disclosure of which is incorporated herein by reference.

Reten 210 is in powder form and is a copolymer of acrylamide and betamethacryloxyethyltrimethylammonium methyl sulphate, having a Brookfield viscosity in a 1% solution of 600–1000 cps.

Reten 220 is in powder form and is a copolymer of acrylamide and betamethacryloxyethyltrimethylammonium methyl sulphate, having a Brookfield viscosity in a 1% solution of 800–1200 cps.

The molecular weight of the Reten polymers are usually relatively high and vary from about 50,000 to about 1,000,000 or more. These high molecular weight polymers are solid products and their main chemical backbone structure is polyacrylamide. To the polyacrylamide various tetra alkyl ammonium compounds can be attached. These quaternary ammonium groups provide the number of positive charges of the polymer.

The cationic copolymer is employed as a dilute aqueous solution of about 0.01% to about 1% by weight and preferably about 0.05% to about 0.5% by weight of the copolymer. The aqueous solution also contains sulfuric acid to provide a pH value of usually about 0 to about 3, more usually about 0 to about 2 and preferably about 1. Low pH values are preferred in order to obtain a relatively low viscosity for the polymer solution to facilitate application of the polymer. The acid is usually present in amounts of about 2% to about 4% by weight, 2% by weight being preferred.

The treatment with the cationic copolymer requires generally about one minute to about ten minutes and preferably about one minute to about two minutes. The multifunctional cationic copolymer provides a surface of a positive polarity while the catalyst particles to be subsequently applied to the substrate have a negative polarity. This difference in polarity provides for electrostatic attraction of the catalyst particles.

After the substrate is contacted with the cationic copolymer composition, the substrate is rinsed to remove any access copolymer not adsorbed by the substrate surface.

Next the substrate surface and/or through-hole surface are activated by means of a colloidal solution containing palladium chloride, stannous chloride and hydrochloric acid. The activation serves to initiate electroless plating process. The surfaces are brought into contact with the colloidal solution preferably for five minutes, however the contact time can vary between one minute and ten minutes. To produce the seeder bath two solutions (A and B) are prepared. About 60 kg of $SnCl_2.2H_2O$ are dissolved in 20 liters of concentrated (37%) HCl with stirring. It is very important to dissolve the $SnCl_2.2H_2O$ in concentrated HCl. Under these conditions no hydrolysis of the Sn-salt takes place. When the salt is totally dissolved, more 37% HCl is added until a volume of 50 liters is reached (solution A). About 1 kg of $PdCl_2$ is dissolved in 15 liters of 37% HCl. This solution is diluted with deionized water until a volume of 50 liters is reached (solution B). Solution B is added slowly to solution A with stirring. The mixture is boiled for two hours. After cooling about 70 grs of a fluorocarbon surfactant, such as FC-95 marketed under this tradename by the Minnesota Mining and Manufacturing Co. and consisting of a perfluoro alkylsulfonate, are added. This solution can be stored for several months. To prepare the actual seeder bath about 130 ml of this solution and about 175 grs of NaCl are taken to a volume of one liter by adding deionized water. This seeder bath contains per liter solution about 80 grs of $SnCl_2.2H_2O$, about 1.2 grs $PdCl_2$, about 85 ml of 37% HCl, about 0.09 g of FC-95 and the NaCl. In order to replenish the seeder bath after it is used for some time, fresh solution can be added. It was found that the seeder bath works satisfactorily if the amount of $SnCl_2.2H_2O$ varies between 80 grs and 150 grs, of $PdCl_2$ between 1.2 grs and 2.6 grs and of HCl between 85 ml and 300 ml per liter of solution.

It contains colloidal particles having a nucleus of palladium and tin in the weight ratio of 1:3 and a shell of chloride ions.

The surfaces are brought into contact with the colloidal solution at room temperature for five minutes, however the contact time can vary between one minute and ten minutes.

The colloidal particles, having a shell of negative chloride ions, adhere by means of electrostatic attraction to the dielectric surface having positive charges due to the treatment with Reten.

Onto the conditioned surfaces a metal, such as nickel or copper, is plated without further treatment prior to the plating except for air drying. The conditioned surfaces may be washed with deionized water, treated with diluted HCl and dried at elevated temperatures prior to the plating. In addition to these process steps, photoresist masks corresponding to the negative of desired metal patterns may be formed on the activated surfaces prior to the plating. The washing, HCl treatment and drying step sequence is especially important if a photoresist mask is applied prior to plating.

Plating without further preceding treatments is particularly applicable, if the conditioned surfaces are restricted to the through-holes. Metals such as nickel or copper are plated by electroless plating onto the treated surface until the desired thickness is reached. The preferred metal employed is copper. The preferred copper electroless plating bath and the method of application are disclosed in U.S. Pat. Nos. 3,844,799 and 4,152,467.

The copper electroless plating bath is generally an aqueous composition which includes a source of cupric ion, a reducing agent, a complexing agent for the cupric ion and a pH adjuster. The plating bath also preferably includes a cyanide ion source and a surface active agent.

The cupric ion source generally used is a cupric sulphate. It is preferred to use 10 grams/liter and most preferably from about 8 grams/liter to about 12 grams/liter. The most common reducing agent employed is formaldehyde which is preferably used in amounts from about 0.7 grams/liter to about 7 grams/liter and most preferably from about 0.7 grams/liter to about 2.2 grams/liter. The most common complexing agent is ethylene diamine tetraacetic acid (EDTA). The amount of complexing agent is dependent upon the amount of cupric ions present in solution and is generally from about 20 grams/liter to about 50 grams/liter, or in a 3-4 fold molar excess. The plating bath can also contain a surfactant which assists in wetting the surface to be coated. A satisfactory surfactant is, for instance, an organic phosphate ester available under the trade designation Gafac RE-610. Generally the surfactant is present in amounts from about 0.02 grams/liter to about 0.3 grams/ liter.

In addition, the pH of the bath is also generally controlled, for instance, by the addition of a basic compound such as sodium hydroxide or potassium hydroxide in the desired amount to achieve the desired pH. The preferred pH of the electroless plating bath is between 11.6 and 11.8. Also preferably, the plating bath contains a cyanide ion in the form of sodium cyanide or ammonium cyanide. The amount is preferably between about 10 mg/liter and about 25 mg/liter to provide a cyanide ion concentration in the bath within the range of 0.0002 molar to 0.0004 molar. The temperature of the bath is preferably maintained between 70° C. and 80° C. and most preferably between 70° C. and 75° C. Also, it is preferred to maintain the $O_2$ content of the bath between about 2 ppm and about 4 ppm and preferably between about 2.5 ppm and about 3.5 ppm. The $O_2$ content can be controlled by injecting oxygen and an inert gas into the bath.

The treatments enumerated above prior to the plating are useful in those cases where metal is plated continuously or selectively onto the major surfaces of the substrates.

The enumerated process steps are described hereinbelow in more detail:

The substrates are rinsed with deionized water. Due to the sudden change of the pH value, most of the chloride ions are replaced by $OH^-$ ions. Subsequently the substrates are treated with 8% HCl, where tin is selectively removed from the substrate surface. This leaves enriched Pd regions with an increased catalytic effect in the plating process. (The amount of Sn is less than 1 $\mu gr/cm^2$ by the HCl treatment whereas the amount of Pd is of the order of 3-4 $\mu grs/cm^2$).

After another rinse with deionized water, the substrates are dried in an oven for 30 minutes at a temperature between about 60° C. and about 70° C. or in a vacuum oven at about 100° C. In the drying operation all the water is driven off irreversibly from the colloidal particles leaving a shell of oxygen in the form of insoluble tin oxide.

If it is intended to produce a blanket metal coating on the substrate surface, the next step is the electroless plating as described above. If the metal is to be applied in an additive process, onto the dried substrate surface a photoresist layer is applied, either by spin-coating or, preferably, by laminating a photoresist foil onto the substrate surface. Such a foil is a negative photoresist and is marketed by DuPont under the type designation T-168. T-168.

By exposure through an appropriate mask exactly aligned to the substrate and subsequent developing, the negative of the desired circuit pattern is produced of the photoresist foil. In the areas corresponding to the desired pattern where the photoresist has been removed in the development step, the catalyzed regions of the substrate surface are exposed. The photoresist process has no detrimental effect on the catalyzed surfaces including the surfaces in the through-holes. No resist blistering is determined in the areas corresponding to the desired pattern.

Next the metal is plated by electroless plating onto the exposed surface areas. The plating process is described hereinbelow with copper as the metal. However the process is transferable to other metals as well. The plating is done in two steps differing in the composition of the baths used and in the duration of the steps.

Both baths contain in one liter of solution about 8 grams to about 10 grams copper sulphate, about 35 grams to about 55 grams ethylene diamine tetraacetic acid (EDTA), about 2 ml to about 3 ml formaldehyde and 0.02 grams to about 0.03 grams of a surfactant. The surfactant assists in wetting the surfaces to be coated. A satisfactory surfactant is, for example, an organic phosphate ester available under the trade designation GaFac RE-610. The preferred pH value of the electroless plating bath is between 11.6 and 11.8 at a temperature of 25° C. The bath used in the first plating step contains no cyanide which permits an oxygen level below 2 ppm. No gas, like air, is bubbled through the bath.

$CN^-$ and $O_2$ form soluble complex ions with Pd. The lower limit of the $O_2$ content can be controlled by injecting oxygen and an inert gas into the bath. The bath used in the second plating step contains about 10 ppm to about 20 ppm cyanide and its oxygen content is about 3 ppm, which is achieved by bubbling air through the bath. It is not necessary to remove the substrates from the first bath and put it in the second. It is also possible to transform the first bath into the second by adding sodiumcyanide and bubbling air through the bath after the first plating period.

The plating takes place at a temperature between 70° C. and 80° C. and preferably between 70° C. and 75° C. where the substrate is plated in the first step from about 15 minutes to about 30 minutes and in the second plating step from about 10 hours to about 20 hours. The plated copper is between about 37.5 and 50 $\mu$m thick.

With the inventive method a homogeneous coverage of all the substrate surface areas exposed including the through-holes is achieved. The thickness of the plated copper is essentially homogeneous and its adhesion to the substrate is excellent. After the plating the photoresist is stripped, preferably with methylene chloride or a similar solvent, and the Pd in the areas not plated with copper is removed by a treatment with a chlorite solution.

The inventive method is applicable especially in processes for producing metal circuit on substrates such as thermosetting and thermoplastic resins and of glass. The method is especially useful for producing high quality copper plated epoxy boards and cards.

The inventive method is also very advantageously applied in processes for reworking substrates that have already undergone electroless plating and eventually soldering, are structurally sound, but have then been rejected due to defects, such as opens or plating voids, solder defects and scratches on the circuitry. The substrates to be reworked are selectively covered with a metal, such as copper, and sometimes also selectively with photoresist and/or tin.

In the first step of the reprocessing the photoresist is stripped, preferably with methylene chloride or a similar organic solvent, and subsequently the substrates are dried. Then the metal is applied by plating and, if present, the tin is removed by etching. If the metal is copper, preferably a $CuCl_2$/HCl solution is used, since this agent etches copper and also tin. At this stage the surface of the substrates apparently exhibit the roughness that is produced in the method described above by laminating a copper sheet with a roughened surface to the substrate surface to be plated and subsequently etching off the copper sheet. From this point on the reprocessing proceeds as described above (e.g., with the process steps of rinsing with an alkaline solution, conditioning the surface with a Reten solution, seeding the surface with palladium/tin salts in a single seed process, rinsing with deionized water, accelerating by removing most of the tin with a 8%-HCl-solution, forming a photoresist mask corresponding to the negative of the desired circuit pattern and finally the selectively electrolessly metal plating).

The following two examples serve to illustrate preferred embodiments of the inventive method and are not intended to limit the teachings as set forth herein.

EXAMPLE I

A glass substrate previously cleaned in alcohol is immersed for about three minutes into a bath of a 2% $H_2SO_4$ aqueous solution containing 0.05 grams of Reten 210 per liter. The substrate is then rinsed with deionized water and dried with air. Next, the coated substrate is immersed in a bath of about 1.5 grams per liter of $PdCl_2$, about 100 grams per liter of $SnCl_2$, about 106 milliliters per liter of 37% HCL and about 0.1 gram of surfactant at about room temperature for about three minutes. The substrate is then air dried. The substrate has a very visible Pd catalytic film thereon. Subsequently the substrate is rinsed in deionized water, treated with 8% HCl at room temperature for ten minutes, rinsed with deionized water for 3 minutes at room temperature and then vacuum dried for 30 minutes at 100° C. Onto the dried substrate a layer of T-168 photoresist is laminated. An illumination mask the masked area of which correspond to the negative of the desired circuit pattern is aligned to the substrate and then the substrate is irradiated through the mask. The developing is followed with a trichloroethane type developer where the seeded areas of the substrate to be plated and corresponding to the desired pattern are exposed. In the areas corresponding to the desired pattern, no resist blistering is detected.

The substrate is then immersed in a copper electroless additive plating bath for about ten minutes. The electroless plating bath contains about 20 grams/liter of $CuSO_4.5H_2O$, 35 grams/liter of EDTA dihydride, 0.25 grams/liter of Gafac RE-610, 14 mg/liter sodium cyanide, and 2 ml/liter of 37% HCHO. The pH of the bath is 11.7 by the addition of NaOH and the temperature of the bath is 73°±5° C. The $O_2$ content of the bath is maintained at about 2.5 ppm to 3.5 ppm. The gas flow rate is about 12 SCFM. In addition the plating racks are continuously agitated during the plating.

The substrate, after plating, has a continuous copper film on the substrate. The produced copper lines show no line tailing.

EXAMPLE II

Onto a substrate consisting of an epoxy resin a 25.4 $\mu$m thick copper sheet having a roughened surface is laminated, by pressing. Into the etched substrate through-holes for producing vias are laser drilled and then cleaned by vapor blasting. The substrate is treated with an aqueous solution containing sodium phosphate and sodium silicate and having a pH value of about 13. The substrate is rinsed with deionized water at a temperature of about 50° for two minutes. Subsequently the substrate is immersed for two minutes in a 0.05% solution of Reten 210 in 2% $H_2SO_4$ having a pH value of 1. After another rinse in warm deionized water, the substrate is immersed in a seeder bath containing per liter of solution about 1.2 grams of $PdCl_2$, about 80 grams of $SnCl_2.2H_2O$, about 85 ml of 37% HCl, about 0.1 gram of the surfactant and 175 grams of NaCl with the rest being water. The solution is prepared as described above.

The substrate is immersed in the seeding bath that has room temperature for three to five minutes. Subsequently the substrate is rinsed in deionized water, treated with 8% HCl at room temperature for ten minutes, rinsed with deionized water for three minutes at room temperature and then vacuum dried for 30 minutes at 100° C. Onto the dried substrate a layer of T-168 photoresist is laminated. An illumination mask, the masked area of which corresponds to the negative of a desired circuit pattern, is aligned with the substrate and then the substrate is irradiated through the mask. The developing is followed with a trichloroethane type developer where the seeded areas of the substrate to be plated and corresponding to the desired pattern are exposed. In the areas corresponding to the desired pattern no resist blistering is detected.

Next the exposed areas of the substrate are electrolessly copper plated. There the substrate is first immersed for about 30 minutes in a bath having a temperature of 72°±2° C. and containing per liter of solution 8–10 grams $CuSO_4$, 35–55 grams EDTA, 0.1 gram Gafac wetting agent, 2–3 ml formaldehyde and less than 2 ppm of oxygen with the rest being water. The bath has a pH value of 11.7 (at 25° C.). Then the substrate is immersed in a second bath that has the same composition as the first bath except that its oxygen content is 3 ppm and it contains 10–20 ppm cyanide. In this bath, also at a temperature of 72°±2° C., the substrate remains 15 hours. The thickness of the plated copper is about 50.8 μm. Finally the photoresist mask is stripped with methylene chloride.

The visual impression of the plated copper is excellent. All the exposed areas of the substrate including the through-holes are covered by a continuous copper film, the thickness of which is essentially homogeneous; and it has a very good adhesion. The copper lines show no line tailing.

While the invention has been particularly shown and described with reference to the embodiment thereof, it will be understood by those skilled in the art that the foregoing and other changes in form and detail may be made therein without departing from the spirit and scope of the invention.

We claim:

1. Method for conditioning at least one surface of a dielectric substrate for eliminating resist blistering from subsequently applied photoresist and for electrolessly plating of a conductive metal thereon comprising:
    bringing said at least one surface into contact with a composition containing $H_2SO_4$ and a multifunctional cationic polymer containing at least two available cationic moieites and wherein said composition has a pH value of between about 0 and about 3, and then activating the surface by treating it with a colloidal solution containing palladium chloride, stannous chloride and HCl.

2. Method according to claim 1 wherein a polymer of polyacrylamide forming the inert backbone and functionally active tetra alkyl ammonium compounds in a $H_2SO_4$ solution is used for contacting said at least one surface.

3. Method according to claim 2 wherein an about 0.05 to about 0.5 weight percent solution of the polymer in $H_2SO_4$ is used for contacting said at least one surface.

4. Method according to claim 2 wherein a polymer of polyacrylamide and betamethacryloxyethyltrimethylammonium methyl sulphate in an $H_2SO_4$ solution is used for contacting said at least one surface.

5. Method according to claim 1 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

6. Method according to claim 2 wherein the surface brought into contacted with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

7. Method according to claim 3 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

8. Method according to claim 4 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.6 grs of $PdCl_2$, 80–150 grs of $SnCl_2.2H_2O$, 85–160 ml of 37% HCl and 0.09–0.16 gr of the surfactant.

9. Method for conditioning at least one surface of a dielectric substrate for eliminating resist blistering from subsequently applied photoresist and for electroless plating with copper thereon comprising:
    bringing into contact said at least one surface with a composition containing $H_2SO_4$ and a multifunctional cationic polymer containing at least two available cationic moieties wherein said composition has a pH value of between about 0 and about 3, and then activating the surface by treating it with a colloidal solution containing palladium chloride, stannous chloride and HCl.

10. Method according to claim 9 wherein a polymer of polyacrylamide forming the inert backbone and functionally active tetra alkyl ammonium compounds in a $H_2SO_4$ solution is used for contacting said at least one surface.

11. Method according to claim 10 wherein an about 0.05 to about 0.5 weight percent solution of the polymer in $H_2SO_4$ is used for contacting said at least one surface.

12. Method according to claim 10 wherein a polymer of polyacrylamide and betamethacryloxyethyltrimethylammonium methyl sulphate in an $H_2SO_4$ solution is used for contacting said at least one surface.

13. Method according to claim 9 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.6 grs of $PdCl_2$, 80–150 grs of $SnCl_2.2H_2O$, 100–140 ml of 37% HCl and 0.09–0.16 gr of the surfactant.

14. Method according to claim 10 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

15. Method according to claim 11 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

16. Method according to claim 12 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.6 grs of $PdCl_2$, 80–150 grs of $SnCl_2.2H_2O$, 85–160 ml of 37% HCl and 0.09–0.16 gr of the surfactant.

17. Method according to claim 9 wherein prior to conditioning said at least one surface, a copper plate is laminated to said at least one surface and subsequently removed by etching and wherein after the activation of said at least one surface said at least one activated surface is rinsed with deionized water, brought into contact with an aqueous solution of HCl, rinsed again and dried at elevated temperatures, a photoresist layer is applied to said at least one dried surface exposed to selective radiation and developed and plating said at least one selectively masked surface by contacting it for a period of from about 15 minutes to about 30 minutes with a first plating bath containing $CuSO_4$, a complexing agent, HCHO and a surfactant with the oxygen content being less than 2 ppm and then for a period of from about 10 hours to about 20 hours with a second plating bath differing from the first plating bath by an increased oxygen content of about 3 ppm to about 4 ppm and an NaCN content of 10 ppm to 20 ppm.

18. Method according to claim 14 wherein prior to conditioning said at least one surface a copper plate is laminated to said at least one surface and subsequently removed by etching and wherein after the activation of said at least one surface said at least one activated surface is rinsed with deionized water, brought into contact with an aqueous solution of HCl, rinsed again and dried at elevated temperatures, a photoresist layer is applied to said at least one dried surface exposed to selective radiation and developed and plating said at least one selectively masked surface by contacting it for a period of from about 15 minutes to about 30 minutes with a first plating bath containing $CuSO_4$, a complexing agent, HCHO and a surfactant with the oxygen content being less than 2 ppm and then for a period of from about 10 hours to about 20 hours with a second plating bath differing from the first plating bath by an increased oxygen content of about 3 ppm to about 4 ppm and an NaCN content of 10 ppm to 20 ppm.

19. Method for conditioning at least one surface of a dielectric substrate of a thermosetting or thermoplastic resin or of a glass for eliminating resist blistering from subsequently applied photoresist and for the electroless plating of conductive metal thereon comprising:
bringing into contact said at least one surface with a composition containing $H_2SO_4$ and a multifunctional cationic polymer containing at least two available cationic moieties and wherein said composition has a pH value of between about 0 and about 3, and then activating the surface by treating it with a colloidal solution containing palladium chloride, stannous chloride and HCl.

20. Method according to claim 19 wherein a polymer of polyacrylamide forming the inert backbone and functionally active tetra alkyl ammonium compounds in a $H_2SO_4$ solution is used for contacting said at least one surface.

21. Method according to claim 20 wherein an about 0.05 to about 0.5 weight percent solution of the polymer in $H_2SO_4$ is used for contacting said at least one surface.

22. Method according to claim 20 wherein a polymer of polyacrylamide and betamethacryloxyethyltrimethylammonium methyl sulphate in an $H_2SO_4$ solution is used for contacting said at least one surface.

23. Method according to claim 19 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

24. Method according to claim 20 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

25. Method according to claim 21 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

26. Method according to claim 22 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

27. Method according to claim 19 wherein the at least one surface of a dielectric is conditioned for electroless plating of copper.

28. Method according to claim 27, wherein a polymer of polyacrylamide forming the inert backbone and functionally active tetra alkyl ammonium compounds in a $H_2SO_4$ solution is used for contacting said at least one surface.

29. Method according to claim 28 wherein an about 0.05 to about 0.5 weight percent solution of the polymer in $H_2SO_4$ is used for contacting said at least one surface.

30. Method according to claim 28 wherein a polymer of polyacrylamide and betamethacryloxyethyltrimethylammonium methyl sulphate in an $H_2SO_4$ solution is used for contacting said at least one surface.

31. Method according to claim 27 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

32. Method according to claim 28 wherein the surface brought into contact with the cationic copolymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

33. Method according to claim 29 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.25 grs of $PdCl_2$, 80–150 grs of $SnCl_2.2H_2O$, 85–160 ml of 37% HCl and 0.09–0.16 gr of the surfactant.

34. Method according to claim 30 wherein the surface brought into contact with the cationic polymer is activated with a colloidal solution prepared from a mixture formed by mixing a solution of $SnCl_2.2H_2O$ in 37% HCl and a solution of $PdCl_2$ in diluted HCl, boiling for two hours and adding a surfactant and containing per liter of solution about 600 grs of $SnCl_2.2H_2O$, about 10 grs of $PdCl_2$, about 650 ml of 37% HCl and 0.7 gr of a surfactant, by diluting fixed amounts of said mixture with deionized water, the colloidal solution containing per liter 1.2–2.5 grs of $PdCl_2$, 80–150 grs of $SnCl_2.2H_2O$, 85–160 ml of 37% HCl and 0.09–0.16 gr of the surfactant.

35. The method of claim 1 wherein an aqueous solution of about 0.01% to about 1% by weight of the copolymer in $H_2SO_4$ with the solution have a pH value of between about 0 and about 2 is used for contacting said at least one surface.

36. The method of claim 1 wherein the pH of said composition is about 1.

37. The method of claim 35 wherein the $H_2SO_4$ is present in said composition in amounts of about 2% to about 4% by weight.

38. The method of claim 1 wherein the $H_2SO_4$ is present in said composition in amounts of about 2% to about 4% by weight.

39. The method of claim 11 wherein an aqueous solution of about 0.01% to about 1% by weight of the copolymer in $H_2SO_4$ with the solution have a pH value of between about 0 and about 2 is used for contacting said at least one surface.

40. The method of claim 11 wherein the pH of said composition is about 1.

41. The method of claim 39 wherein the $H_2SO_4$ is present in said composition in amounts of about 2% to about 4% by weight.

42. The method of claim 11 wherein the $H_2SO_4$ is present in said composition in amounts of about 2% to about 4% by weight.

43. The method of claim 19 wherein an aqueous solution of about 0.01% to about 1% by weight of the copolymer in $H_2SO_4$ with the solution have a pH value of between about 0 and about 2 is used for contacting said at least one surface.

44. The method of claim 19 wherein the pH of said composition is about 1.

45. The method of claim 43 wherein the $H_2SO_4$ is present in said composition in amounts of about 2% to about 4% by weight.

46. The method of claim 19 wherein the $H_2SO_4$ is present in said composition in amounts of about 2% to about 4% by weight.

* * * * *